United States Patent
Lidow et al.

(10) Patent No.: US 8,853,749 B2
(45) Date of Patent: Oct. 7, 2014

(54) ION IMPLANTED AND SELF ALIGNED GATE STRUCTURE FOR GAN TRANSISTORS

(75) Inventors: Alexander Lidow, Marina Del Ray, CA (US); Jianjun Cao, Torrance, CA (US); Robert Beach, La Crescenta, CA (US); Robert Strittmatter, La Canada, CA (US); Guang Y. Zhao, Torrance, CA (US); Alana Nakata, Redondo Beach, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 13/362,669

(22) Filed: Jan. 31, 2012

(65) Prior Publication Data

US 2012/0193688 A1 Aug. 2, 2012

Related U.S. Application Data

(60) Provisional application No. 61/438,090, filed on Jan. 31, 2011.

(51) Int. Cl.
| | |
|---|---|
| *H01L 29/76* | (2006.01) |
| *H01L 21/336* | (2006.01) |
| *H01L 29/423* | (2006.01) |
| *H01L 29/778* | (2006.01) |
| *H01L 29/66* | (2006.01) |
| *H01L 21/265* | (2006.01) |
| *H01L 29/20* | (2006.01) |

(52) U.S. Cl.
CPC .... *H01L 21/26586* (2013.01); *H01L 29/42316* (2013.01); *H01L 29/7787* (2013.01); *H01L 29/66462* (2013.01); *H01L 29/2003* (2013.01); *H01L 21/26546* (2013.01)
USPC .......................................... 257/288; 438/301

(58) Field of Classification Search
USPC ............ 257/288, E29.255, E21.409; 438/301
See application file for complete search history.

(56) References Cited

U.S. PATENT DOCUMENTS

| | | | | |
|---|---|---|---|---|
| 5,132,752 A | * | 7/1992 | Umemoto et al. | 257/615 |
| 5,161,235 A | * | 11/1992 | Shur et al. | 257/24 |
| 6,914,273 B2 | * | 7/2005 | Ren et al. | 257/194 |
| 8,377,810 B2 | * | 2/2013 | Nowak | 438/570 |
| 2001/0015437 A1 | | 8/2001 | Iishi et al. | |
| 2006/0060871 A1 | | 3/2006 | Beach | |
| 2008/0087915 A1 | * | 4/2008 | Uemoto et al. | 257/192 |
| 2010/0258842 A1 | | 10/2010 | Lidow et al. | |
| 2010/0258843 A1 | | 10/2010 | Lidow et al. | |
| 2010/0330754 A1 | * | 12/2010 | Hebert | 438/172 |
| 2011/0275183 A1 | * | 11/2011 | Beach | 438/172 |

* cited by examiner

*Primary Examiner* — Fernando L Toledo
*Assistant Examiner* — Neil Prasad
(74) *Attorney, Agent, or Firm* — Dickstein Shapiro LLP (57) ABSTRACT

A self-aligned transistor gate structure that includes an ion-implanted portion of gate material surrounded by non-implanted gate material on each side. The gate structure may be formed, for example, by applying a layer of GaN material over an AlGaN barrier layer and implanting a portion of the GaN layer to create the gate structure that is laterally surrounded by the GaN layer.

17 Claims, 8 Drawing Sheets

FIG. 1

Prior Art

ION IMPLANTED AND SELF ALIGNED GATE STRUCTURE FOR GAN TRANSISTORS

CROSS REFERENCE TO RELATED APPLICATIONS

This application claims the benefit of U.S. Provisional Application No. 61/438,090, filed on Jan. 31, 2011, which is hereby incorporated by reference in its entirety.

FIELD OF THE INVENTION

The present invention relates to the field of semiconductor devices. In particular, the invention relates to the formation of transistors, including enhancement mode gallium nitride transistors.

BACKGROUND OF THE INVENTION

Semiconductor devices use the conductive properties of semiconductor materials. Such semiconductor materials may include, for example, silicon (Si) or silicon-containing materials, germanium, or materials including gallium nitride (GaN).

In particular, gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages, e.g., 100 Volts, while operating at high frequencies, e.g., 0.1-100 GHz.

One example of a GaN HEMT device includes a nitride semiconductor with at least two nitride layers. Different materials formed on the semiconductor or on a buffer layer causes the layers to have different band gaps. The different material in the adjacent nitride layers also causes polarization, which contributes to a conductive two dimensional electron gas (2DEG) region near the junction of the two layers, specifically in the layer with the narrower band gap.

In a GaN semiconductor device, the nitride layers that cause polarization typically include a barrier layer of AlGaN adjacent to a layer of GaN to include the 2DEG, which allows charge to flow through the device. This barrier layer may be doped or undoped. Because of the 2DEG region existing under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide. An enhancement mode device requires a positive bias applied at the gate in order to conduct current. Examples of GaN semiconductor devices can be found in commonly assigned U.S. Patent Application Publication Nos. 2010/0258912 and 2010/0258843, both of which are incorporated by reference in their entirety.

Figure 1:
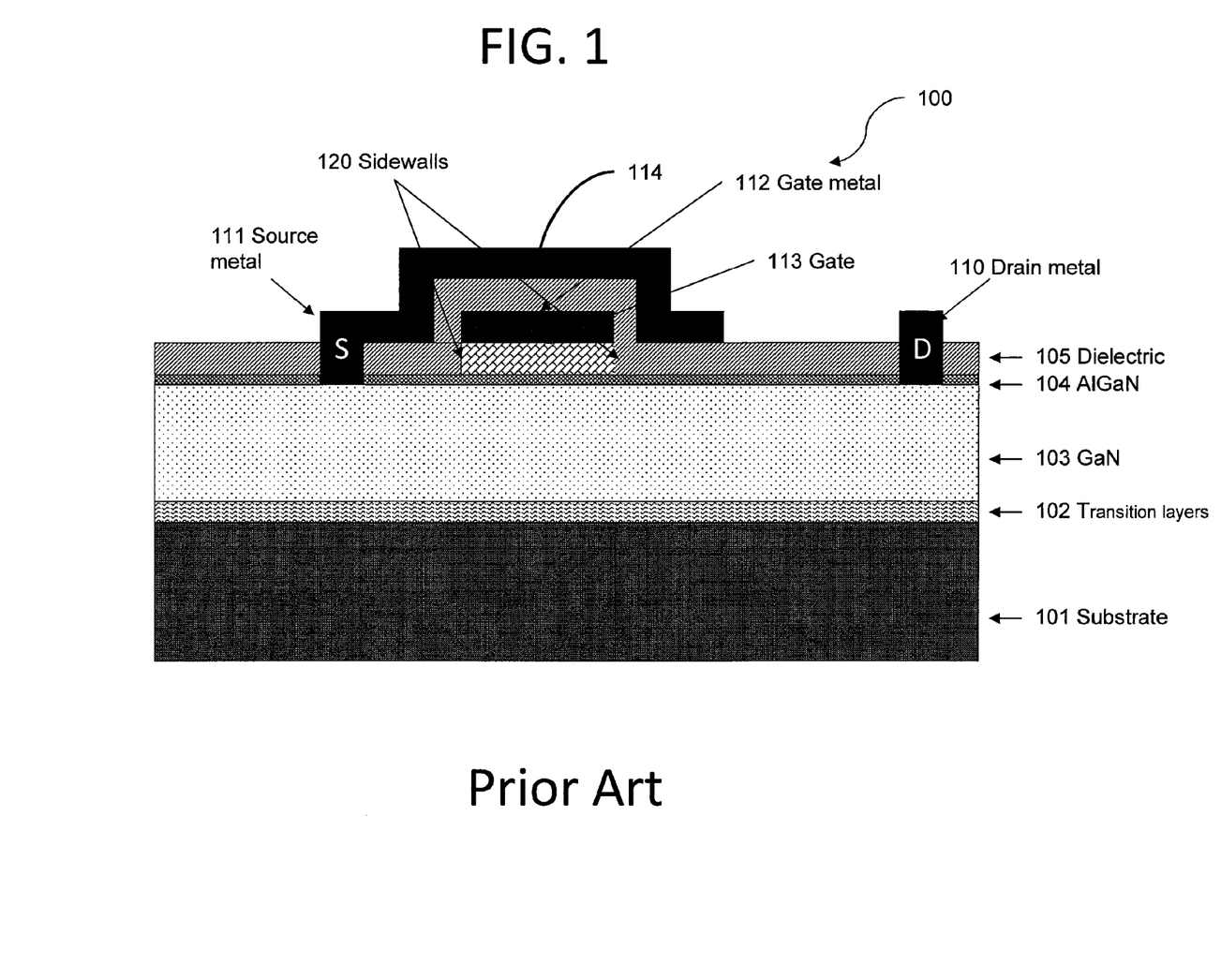
FIG. 1 illustrates a cross-sectional view of a known enhancement mode GaN transistor device.

FIG. 1 illustrates a cross-sectional view of one example of an enhancement mode GaN transistor device 100 with a self-aligned gate structure. Commonly assigned U.S. Patent Application Publication No. 2010/0258843 discloses a process for forming such a device. In FIG. 1, device 100 includes substrate 101, which may be either sapphire, SiC, or silicon, transition layers 102, un-doped GaN material 103, un-doped AlGaN barrier material 104, drain ohmic contact metal 110, source ohmic contact metal 111, a doped p-type AlGaN or p-type GaN layer formed into a doped epitaxial gate 113, and gate metal 112 formed over the doped epitaxial gate 113. A layer of dielectric material 105, such as silicon nitride, covers the barrier material 104, such that a portion 114 of the dielectric material covers gate 113.

During formation of the gate structure for device 100, the top p-type AlGaN or GaN layer may be implanted, diffused, or grown with a dopant such as magnesium (Mg), and then a metal layer composed of, for example, titanium nitride (TiN) is deposited on top of the doped GaN. Photolithography may be used to define the desired boundaries of the gate, and the metal layer is then etched away according to the desired boundaries. The etched metal gate material may then be used as an etch mask to create a self-aligned gate structure including the gate metal 112 and the doped epitaxial gate 113, with the doped epitaxial gate 113 including sidewalls 120 defined by the gate metal 112.

One undesirable feature of the structure shown in FIG. 1 is that, when removing the Mg-doped epitaxial GaN material external to that portion that is used for the gate, a very sensitive etch is required to avoid interfering with the underlying barrier layer. Another undesirable feature in conventional transistors is that electrical current can flow down the sidewalls 120 of the doped epitaxial gate 113. Further, while reducing the thickness of the doped epitaxial gate 113 can produce a more desirable device transconductance, it can also increase the leakage current along the gate sidewalls 120. This can decrease efficiency and increase power losses, particularly when compared to silicon transistors. Furthermore, the interface between the SiN material 105 and the sidewalls 120 may tend to rupture. This limits the maximum voltage that can be applied to the gate without destroying the device.

Accordingly, it is desirable to achieve improved gate structures for GaN and other transistor devices, and methods of forming these gate structures.

SUMMARY OF THE INVENTION

Embodiments described below address the problems discussed above and other problems, by providing a gate structure with reduced gate leakage current. The described gate structure includes an ion-implanted portion of gate material surrounded by non-implanted gate material on each side. The gate structure may be formed, for example, by applying a layer of GaN material over an AlGaN barrier layer and implanting a portion of the GaN layer to create the gate structure that is laterally surrounded by the GaN layer.

DETAILED DESCRIPTION OF THE INVENTION

In the following detailed description, reference is made to certain embodiments. These embodiments are described with sufficient detail to enable those skilled in the art to practice them. It is to be understood that other embodiments may be employed and that various structural, logical, and electrical changes may be made.

While embodiments described herein include GaN semiconductor devices, it should be understood that the invention is not limited to GaN semiconductor devices. For example, the described embodiments may be applicable to semiconductor devices and other devices that use different conductive materials, such as, for example, Si or SiC semiconductor devices, Ge-material semiconductor devices, to name but a few. The described concepts are also equally applicable to silicon-on-oxide (SOI) devices. In addition, the described concepts are equally applicable to both enhancement mode and depletion mode devices.

In addition, for purposes of clarity, the concepts contained herein are described in reference to a single transistor device. It should be understood, however, that the concepts described herein are equally applicable to structures including multiple devices, such as structures including multiple devices on a single wafer (i.e., an integrated circuit).

Figure 2:
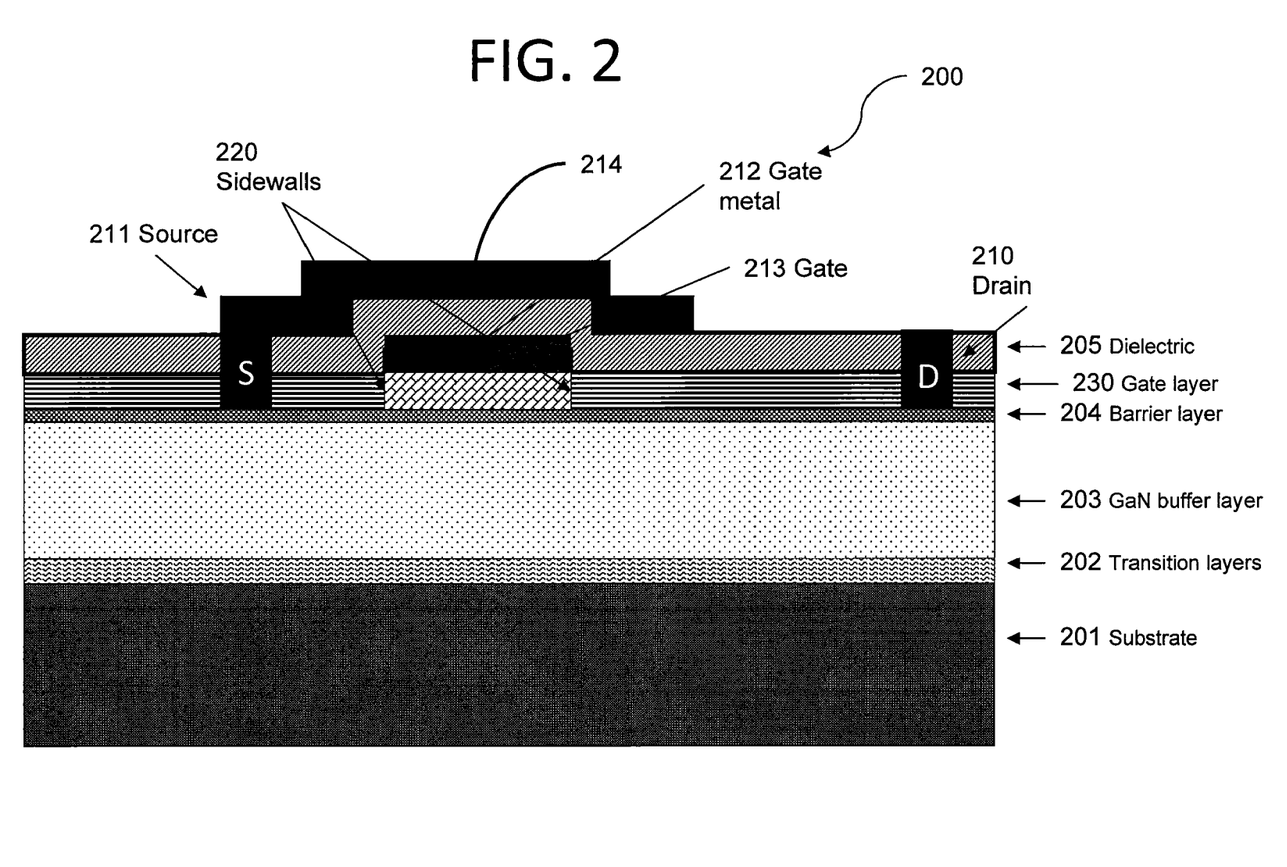
FIG. 2 illustrates a cross-sectional view of a transistor device formed according to a first embodiment of the present invention.

FIG. 2 illustrates a cross-sectional view of a transistor device 200 formed according to a first embodiment of the present invention. Device 200 includes substrate 201, transition layers 202, buffer layer 203, and barrier layer 204. Substrate 201 may be composed of, for example, silicon (Si), silicon carbide (SiC), sapphire, or other material. Transition layers 202 may be one or more transition layers and may be composed of aluminum nitride (AlN) and/or aluminum gallium nitride (AlGaN), and which may be about 0.1 to about 1.0 µm in thickness. Buffer layer 203 may be composed of un-doped GaN material, and is typically about 0.5 to about 3 µm in thickness. Barrier layer 204 may be composed of AlGaN where the Al to Ga ratio is about 0.1 to about 1 with a thickness of about 0.01 to about 0.03 µm.

Device 200 also includes a gate layer 230 formed above (i.e., on top of) the barrier layer 204. Gate layer 230 may be composed of GaN, or any other appropriate gate material. A gate 213 is formed at a desired location within gate layer 230, and is defined at sides 220. It should be understood that, because gate 213 is formed from a portion of gate layer 230, gate 213 in effect does not include "sidewalls," unlike the gate in conventional designs. Gate 213 may be composed of a portion of gate layer 230 (e.g., GaN) where the material that has been appropriately implanted with ions, such as Magnesium (MG), Iron (Fe), Vanadium (V), Chromium (Cr), or Carbon (C). Gate 213 is preferably a p-type material.

Gate metal 212 is above (i.e., on top of) gate 213. Gate metal 212 may be composed of, for example, Titanium Nitride (TiN), Tantalum (Ta), Tantalum Nitride (TaN), Palladium (Pd), Tungsten (W), Tungsten Silicide (WSi$_2$), Nickel (Ni), and/or Gold (Au).

Device 200 also includes a dielectric material 205, such as silicon nitride, formed above the gate material 230, such that at least a portion 214 of the dielectric material covers gate 213 and gate metal 212. Device 200 also includes ohmic contact metal over drain 210 and source 211 areas. The ohmic contact metal may be composed of Ti and/or Al, and may also include a capping metal such as Ni and Au.

Because gate 213, in effect, does not include lateral sidewalls, current leakage at the sidewalls of gate 213 is reduced over conventional designs. In addition, gate 213 has a lower likelihood of rupturing or separating from the adjacent material 230 than in conventional designs, where the gate can separate from surrounding SiN. Furthermore, and as described further below, device 200 can be formed without the need for a highly sensitive gate etch used in conventional designs, and without adding additional masking steps to the fabrication of the device or substantial bulk to the finished product.

FIGS. 3-7 illustrate cross-sectional views showing a transistor device, such as device 200 (FIG. 2) or other described embodiments, at multiple junctures during formation of the device.

Figure 3:
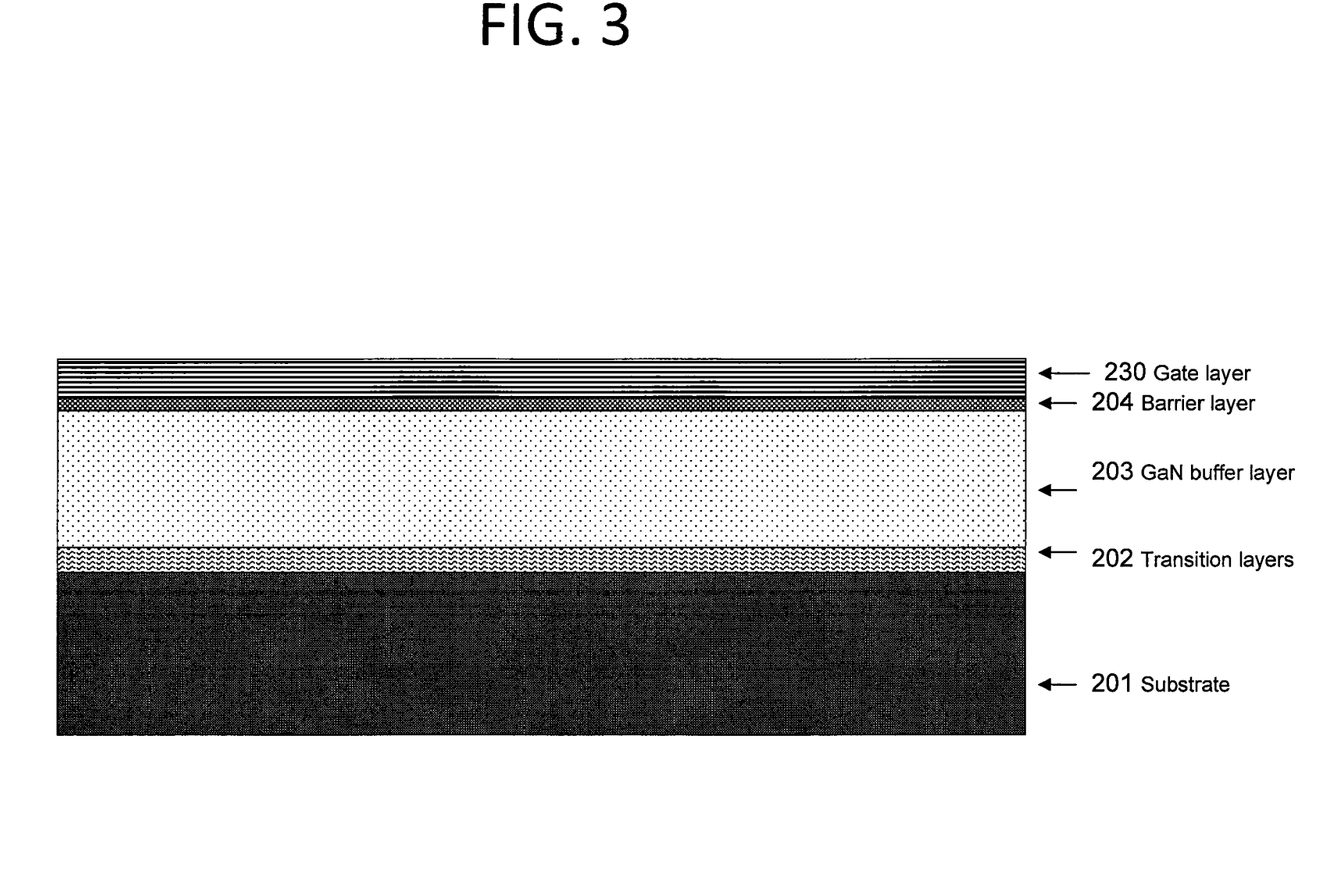
FIG. 3 illustrates a cross-sectional view of a transistor device according to embodiments described herein at a first juncture of its formation.

As shown in FIG. 3, substrate 201, transition layers 202, buffer layer 203, and barrier layer 204 are provided. While these layers are shown for purposes of explanation, it should be understood that the concepts described herein could also be applied to devices formed from other compound semiconductors, such as GaAs, InGaN, AlGaN, and others. In addition, the described concepts could be applied to single crystal or other epitaxial transistors, as are known in the art.

A gate layer 230 is formed above (i.e., on top of) the barrier layer 204. Gate layer 230 may be composed of GaN, or any other appropriate gate material. The gate layer 230 may be formed to a thickness equivalent to the desired thickness of the gate 213 (FIG. 2), for example, in range of about 100 Å to about 300 Å.

Figure 4:
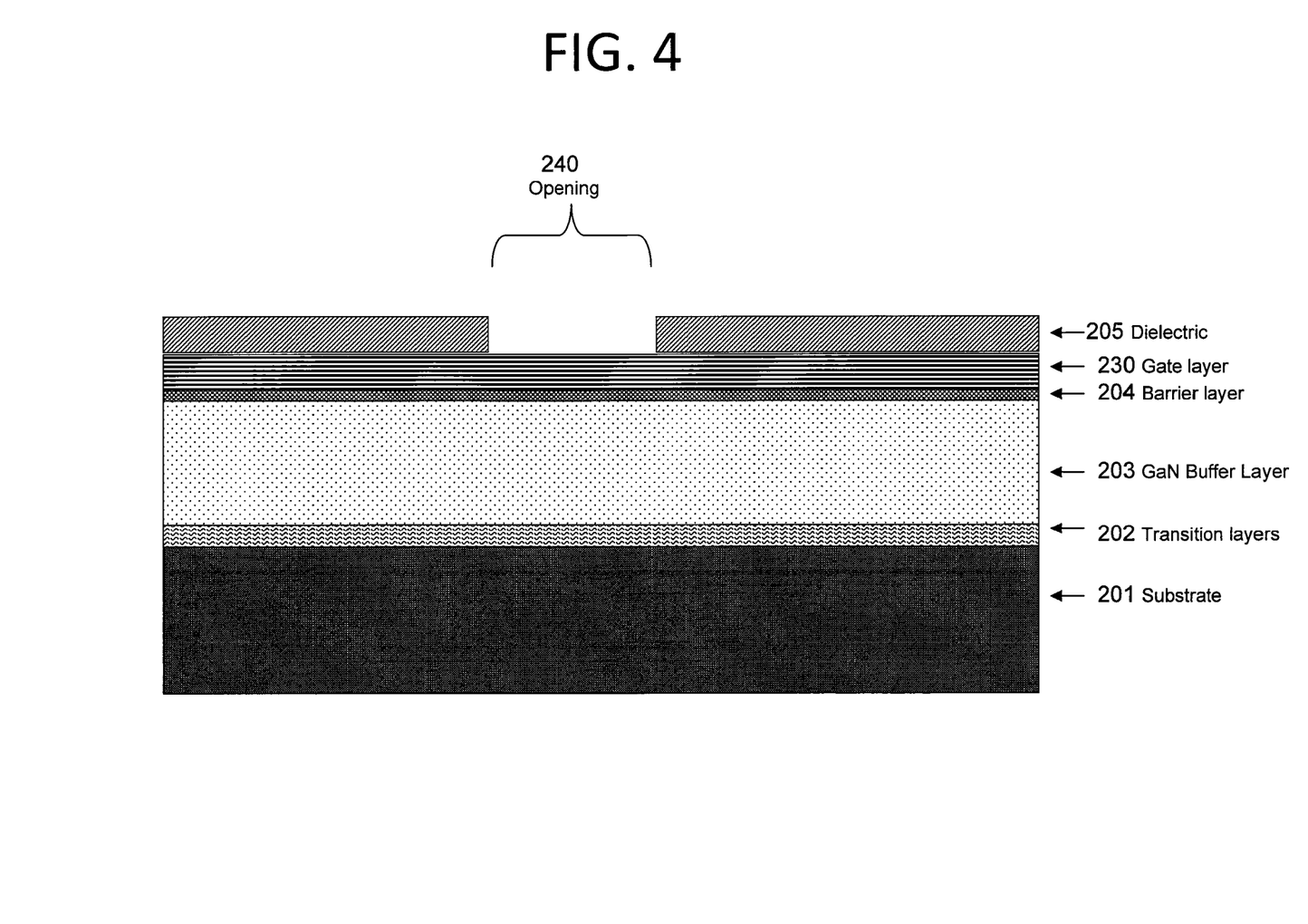
FIG. 4 illustrates a cross-sectional view of a transistor device according to embodiments described herein at a second juncture of its formation.

As shown in FIG. 4, a dielectric material 205, such as silicon nitride, is then deposited above the gate material 230. An opening 240 is formed in dielectric material 205 to a desired surface area of the gate 213 (FIG. 2), exposing a portion of the gate material 230.

Figure 5:
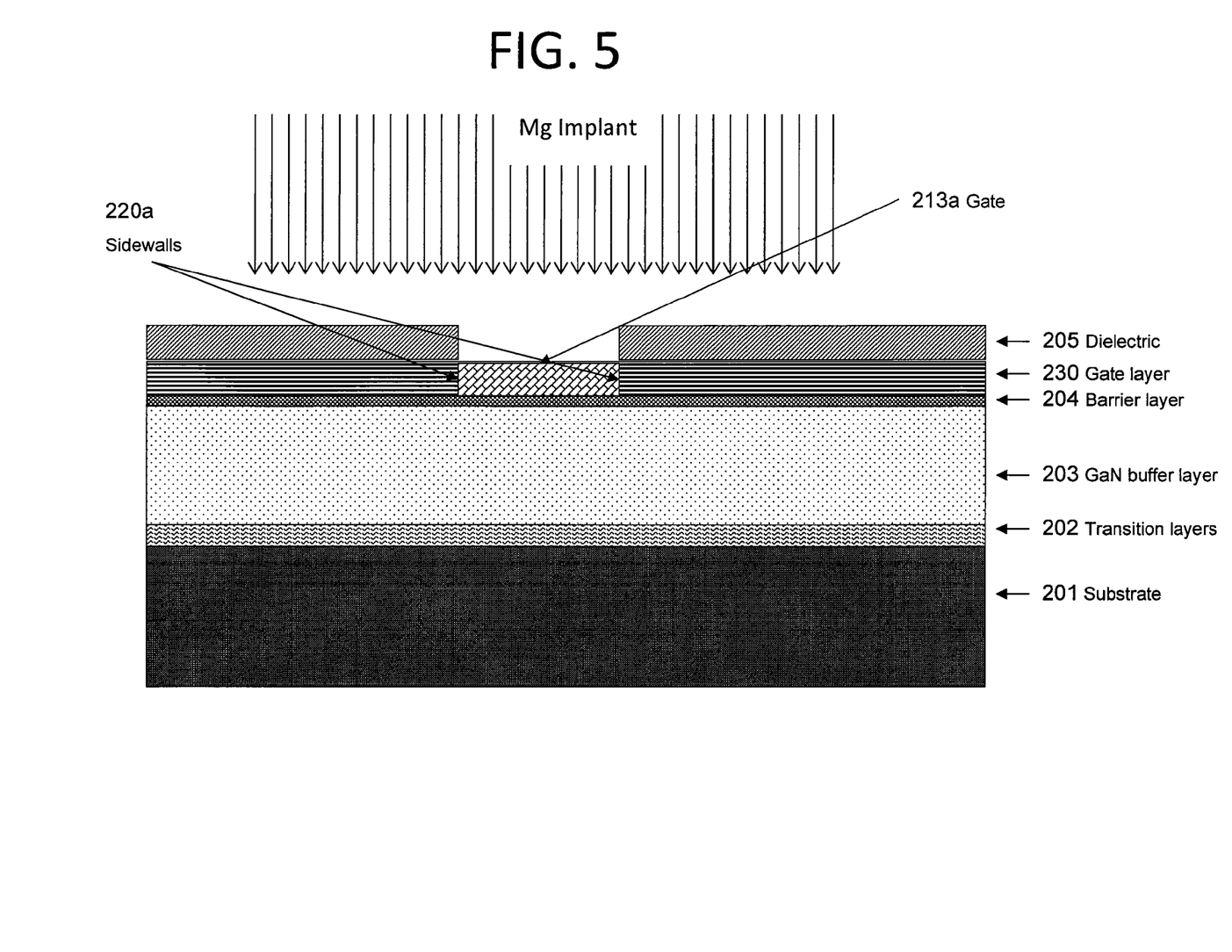
FIG. 5 illustrates a cross-sectional view of a transistor device according to embodiments described herein at a third juncture of its formation.

As shown in FIG. 5, the device is then exposed to ion implantation and, optionally, activation. Implantation may include implantation via ion beam of p-type impurities, including Mg, Fe, V, Cr, or C ions, or other types of ions for creating the desired gate doping. Activation may include subjecting the device to annealing (such as Rapid Thermal Annealing or "RTA") in order to activate the implanted impurities. Optionally, an additional dielectric protective layer—such as a silicon nitride layer—can be formed and then removed for activation. Alternatively, this activation step may be done at another time in the process.

As a result of the ion implantation, an implanted gate 213a is formed in the exposed portion of gate material 230. As shown in FIG. 5, ion implantation may be performed at an angle substantially perpendicular to the surface of the formed layers 201-205. This results in a gate with substantially vertical sides 220a.

Figure 6:
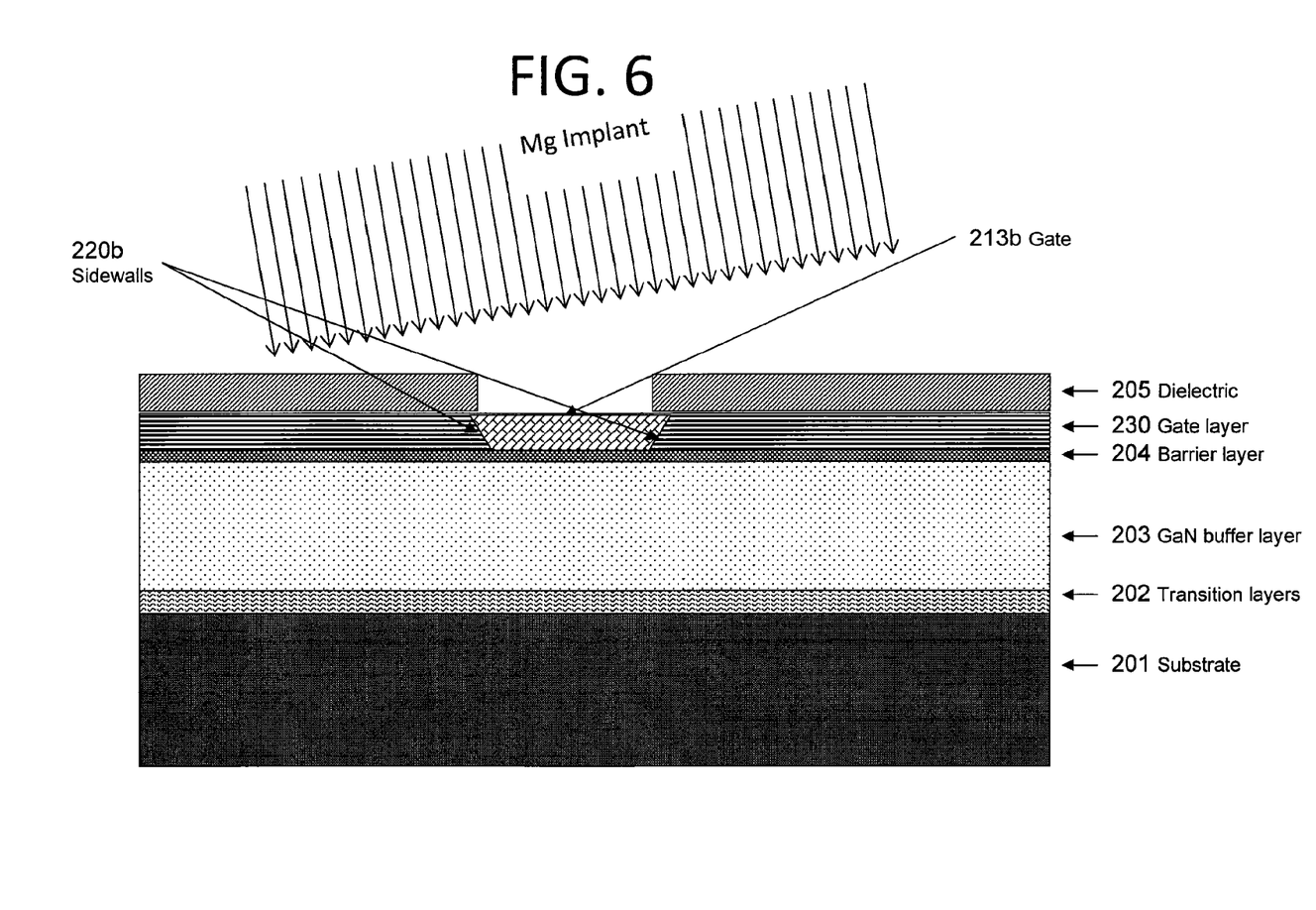
FIG. 6 illustrates a cross-sectional view of a transistor device according to another embodiment described herein.

In another embodiment shown in FIG. 6, ion implantation may be performed at an angle that is not substantially perpendicular to the surface of the formed layers 201-205. This results in a gate 213b with sides 213b that extend beyond the aperture 240 (FIG. 4) in the dielectric layer 205. The profile of the implanted gate can thus be extended beyond the gate metal 212 (FIG. 2), further reducing leakage from the corner of the gate metal into the non-implanted regions of gate material 230.

Figure 7:
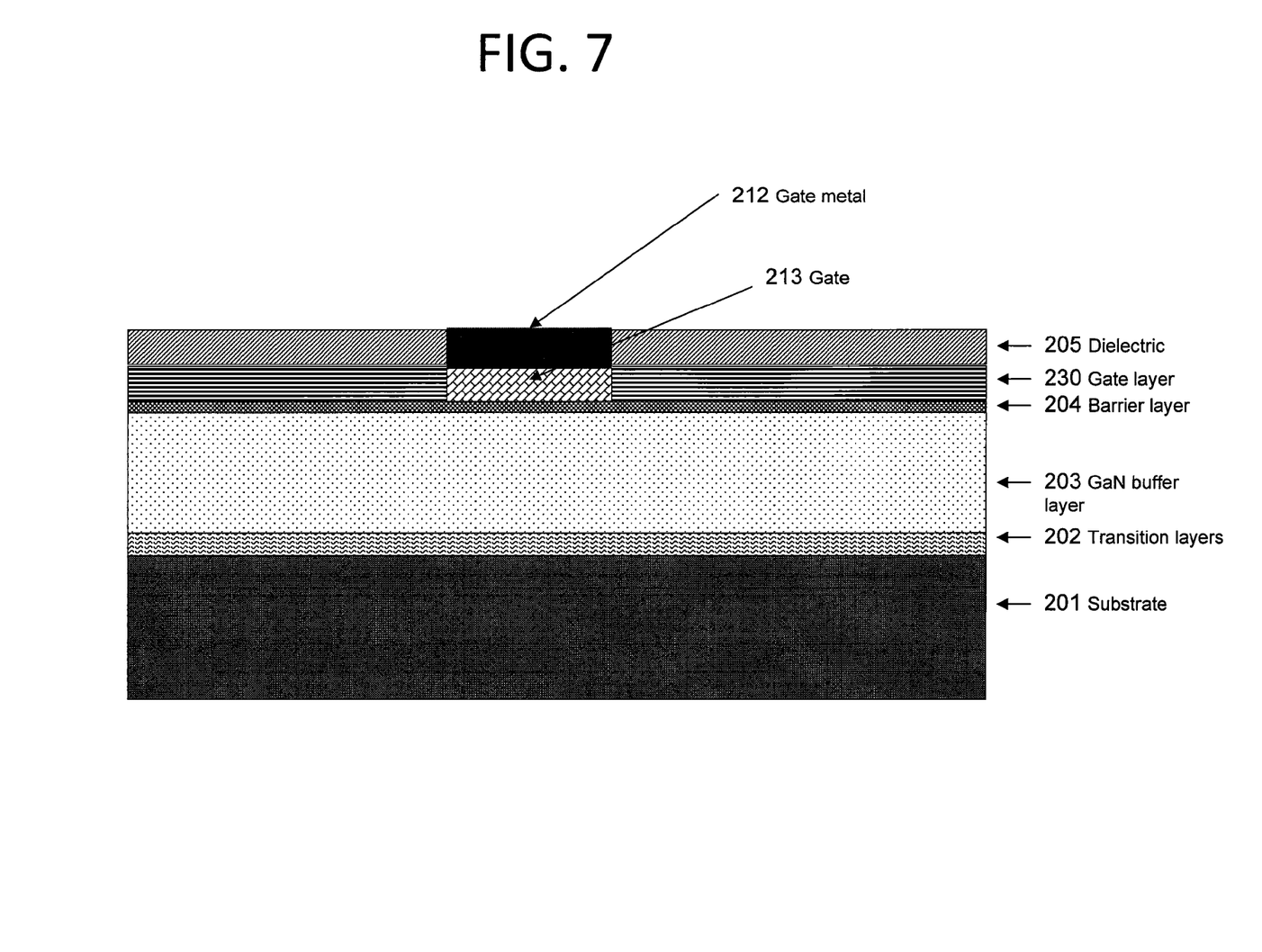
FIG. 7 illustrates a cross-sectional view of a transistor device according to embodiments described herein at a fourth juncture.

As shown in FIG. 7, after the implantation of gate 213 (which may include the configuration of gate 213a shown in FIG. 5 or 213b shown in FIG. 6), gate metal 212 may then be formed above gate 213. A layer of the gate metal may be deposited across a portion of the surface of device 200 (FIG. 2), across the entire surface, or across an entire wafer.

Opening 240 (FIG. 4) in dielectric layer 205, which is the same layer used to define the gate 213, is used to define gate metal 212. Thus, the gate metal 212 will be self-aligned to the active gate region, saving additional manufacturing steps and/or costs and also reducing undesirable overlap between the dielectric layer and the source and/or drain contacts 210, 211 (FIG. 2). Such overlap is undesirable because it can lead to unwanted capacitance, which can slow the device's operation and increase overall power losses in the device.

After formation of the gate metal 212, transistor device 200 (FIG. 2) may be completed through processes and techniques commonly known in the art. For example, an additional amount 214 of dielectric material, such as SiN, may be formed over at least the portion of the device where gate metal 212 is located, providing isolation for the device. Ohmic contact metal may also be deposited to form drain ohmic contact 210 and source ohmic contact 211. Source ohmic contact 210 may be provided above gate 213, as shown in FIG. 2, and act as a field plate to reduce the electric field at the corner of the gate 213 closest to drain ohmic contact 210.

A device formed according to FIGS. 3-7 possesses the desirable characteristics of reduced gate leakage current and higher gate breakdown voltage, and does not require a sensitive gate etch used in conventional processes to remove gate material surrounding the desired gate surface area. The self-aligned deposit of gate metal does not add mask steps to the fabrication process or substantial size to the transistor.

Figure 8:
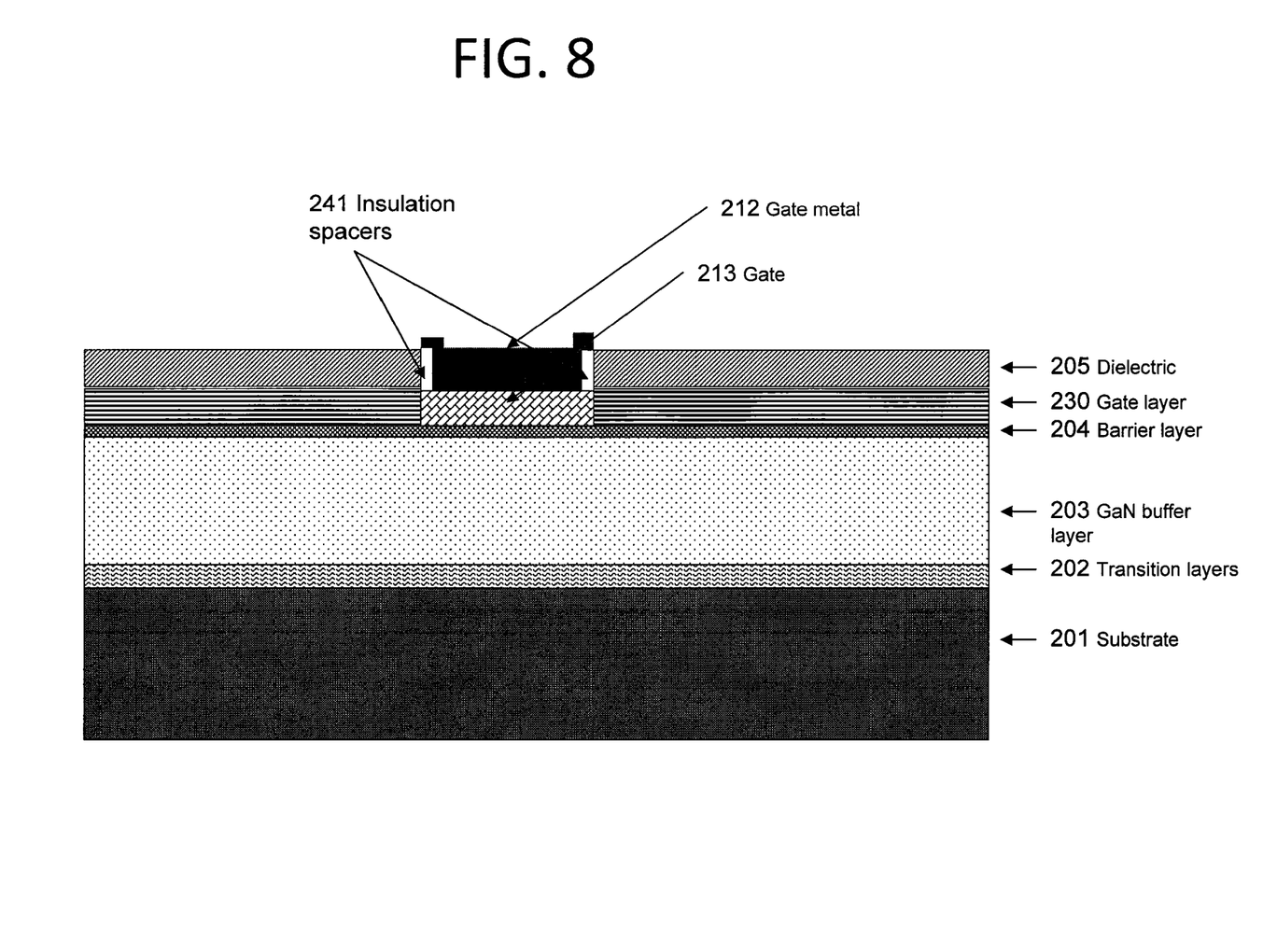
FIG. 8 illustrates a cross-sectional view of a transistor device according to another embodiment described herein.

FIG. 8 illustrates a cross-sectional view showing the formation of an alternative embodiment of a transistor device. As shown in FIG. 8, substrate 201, transition layers 202, buffer layer 203, barrier layer 204, gate layer 230, dielectric material 205, and gate 213 are formed as described above in FIGS. 3-6. Following formation of gate 213, a layer of insulating material, such as SiN, may be formed on the surface of the device (such as through a conformal deposit), and then subsequently removed (such as through etching). This maskless self-aligned deposit and removal process leaves a thin layer of insulating material 241 remaining along the vertical sidewalls of the opening 240 (FIG. 4) in insulating material 205. The remainders 241 formed by this process are commonly referred to as spacers. The gate metal 212 may then be formed inset from the edge of the gate 213. This configuration further reduces current leakage.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A transistor comprising:
   a substrate;
   transition material formed over the substrate;
   a buffer material formed over the transition material;
   a barrier material formed over the buffer material;
   a gate layer formed over the barrier material;
   a dielectric layer with an opening formed over the gate layer;
   a gate metal formed in the opening of the dielectric layer, the gate metal being self-aligned with a gate region; and
   source and drain contacts,
   wherein the gate layer comprises a doped portion defining the gate region that is disposed under the opening of the dielectric layer and an undoped portion outside of the gate region adapted to reduce current leakage, and
   wherein the doped portion defining the gate region is doped with implanted ions from a group consisting of Mg, Fe, V, Cr and C.

2. The transistor of claim 1, wherein the gate metal comprises one of TiN, Ta, TaN, Pd, W, WSi2, Ni and Au.

3. The transistor of claim 1, wherein the barrier material comprises AlGaN.

4. The transistor of claim 1, wherein sides of the gate have an angle of about 90 degrees with respect to the gate layer.

5. The transistor of claim 1, wherein sides of the gate are not perpendicular to the gate layer.

6. The transistor of claim 1, wherein insulating material is formed on sides of the gate metal.

7. The transistor of claim 1, wherein the gate metal is TiN.

8. A method of forming a transistor with a self-aligned gate, the method comprising:
   forming transition layers on a substrate;
   forming a GaN buffer layer over the transition layers;
   forming a barrier layer over the GaN buffer layer;
   forming a gate layer over the barrier layer, wherein the gate layer is undoped;
   forming a dielectric layer over the gate layer;
   forming an opening through the dielectric layer to the gate layer to expose a portion of the gate layer;
   performing an ion implantation process containing p-type impurities through the opening in the dielectric layer to form an ion implanted region of the gate layer, wherein the ion implanted region defines a gate region and a non-ion implanted region outside the gate region for reducing current leakage;
   forming a gate metal material over the gate region using the opening through the dielectric layer to define a gate metal that is self-aligned with the gate region; and
   forming Ohmic drain and source contact regions.

9. The method of claim 8, further comprising an activation process after the ion implantation process.

10. The method of claim 9, wherein the activation process comprises a rapid thermal annealing process.

11. The method of claim 8, wherein the ion implantation process implants ions selected from the group consisting of Mg, Fe, V, Cr and C.

12. The method of claim 8, wherein the gate metal comprises one of TiN, Ta, TaN, Pd, W, WSi2, Ni and Au.

13. The method of claim 8, wherein the barrier layer comprises AlGaN.

14. The method of claim 8, wherein sides of the gate have an angle of about 90 degrees with respect to the gate layer.

15. The method of claim 8, wherein sides of the gate are not perpendicular to the gate material.

16. The method of claim 8, wherein insulating material is formed on sides of the gate metal to form spacers to further reduce leakage current.

17. The method of claim 8, wherein the gate metal is TiN.

* * * * *